US012718869B2

(12) United States Patent
Lee et al.

(10) Patent No.: US 12,718,869 B2
(45) Date of Patent: Aug. 25, 2026

(54) APPARATUS INCLUDING MEMORY WORD LINE STRUCTURE

(71) Applicant: MICRON TECHNOLOGY, INC., Boise, ID (US)

(72) Inventors: Jun Ho Lee, Higashihiroshima (JP); Byung Yoon Kim, Boise, ID (US)

(73) Assignee: Micron Technology, Inc., Boise, ID (US)

(*) Notice: Subject to any disclaimer, the term of this patent is extended or adjusted under 35 U.S.C. 154(b) by 127 days.

(21) Appl. No.: 18/780,226

(22) Filed: Jul. 22, 2024

(65) Prior Publication Data

US 2025/0210091 A1 Jun. 26, 2025

Related U.S. Application Data

(60) Provisional application No. 63/612,849, filed on Dec. 20, 2023.

(51) Int. Cl.
*G11C 11/408* (2006.01)

(52) U.S. Cl.
CPC ................................ *G11C 11/4085* (2013.01)

(58) Field of Classification Search
CPC .......................... G11C 11/4085; G11C 11/408
USPC .................................................... 365/189.11
See application file for complete search history.

(56) References Cited

U.S. PATENT DOCUMENTS 11,600,316 B2 * 3/2023 Partsch ............... G11C 11/4085
2021/0217755 A1 * 7/2021 Hishida .................. H10B 43/35
2023/0096256 A1 * 3/2023 Sasaki .................... H10B 12/50
257/213

* cited by examiner

*Primary Examiner* — Muna A Techane
(74) *Attorney, Agent, or Firm* — Dorsey & Whitney LLP

(57) ABSTRACT

Some embodiments of the disclosure provide an apparatus comprising: a word line array including a plurality of word lines each extending through a memory mat in a first horizontal direction, the plurality of word lines including first and second word lines arranged adjacent to each other in a second horizontal direction; and a word line contact of the first word line, the word line contact separated from the second word line by a gap. The first and second word lines each have a first oxide film at a center area of the word line array in the memory mat. The first and second word lines each have a second oxide film at an edge area of the word line array outside the memory mat, the second oxide film having a thickness greater than a thickness of the first oxide film.

20 Claims, 9 Drawing Sheets

APPARATUS INCLUDING MEMORY WORD LINE STRUCTURE

CROSS REFERENCE TO RELATED APPLICATION(S)

This application claims priority to U.S. Provisional Application No. 63/612,849, filed Dec. 20, 2023. The aforementioned application is incorporated herein by reference, in its entirety, for any purpose.

BACKGROUND

High data reliability, high speed of memory access, low power consumption, and reduced chip size are some features that are demanded from a semiconductor memory device, such as a dynamic random-access memory (DRAM). A memory device includes a plurality of memory cells to store information. Memory cells may be organized at intersections of word lines and bit lines. Word lines may be arranged in an array of rows and bit lines may be arranged in an array of columns, forming a line matrix on a horizontal plane or in a plane view. During an access operation, a word line may be activated and data may be read out from memory cells along bit lines to sense amplifiers, which may detect the information stored in the memory cells.

Each word line may have a word line contact coupled thereto and in electrical contact therewith for, for example, electrically connecting the word line to other circuit components or elements. On a vertical plane or in a cross-sectional view, a bottom portion of the word line contact may be coupled to a top portion of the word line. In the word line array, the word line contact of one word line (or a first word line) in one row may be separated by a gap from another word line (or a second word line) arranged adjacent to the first word line in another row to prevent a short circuit between the word line contact and the second word line. As design rules require a memory device to shrink further, the gap, which may be referred to as having a short-circuit margin or simply a short margin, between the word line contact of the first word line and the second word line may become smaller. There is therefore a demand for providing such a gap or a margin sufficiently large to prevent the short circuit.

DETAILED DESCRIPTION

Figure 1:
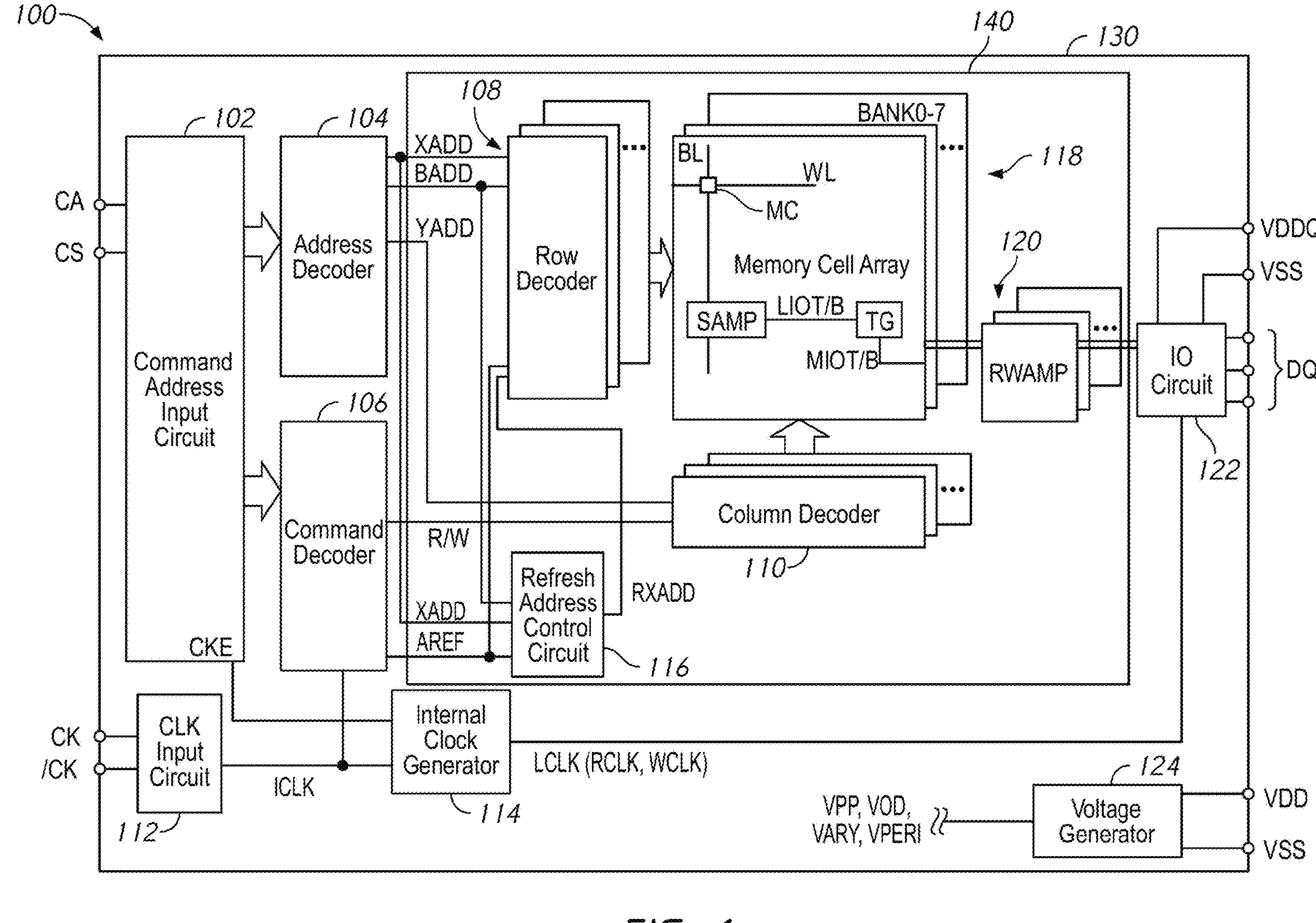
FIG. 1 is a block diagram of an example semiconductor system according to an embodiment of the disclosure.

Various example embodiments of the disclosure will be described below in detail with reference to the accompanying drawings. The following detailed descriptions refer to the accompanying drawings that show, by way of illustration, specific aspects in which embodiments of the disclosure may be practiced. These embodiments are described in sufficient detail to enable those skilled in the art to practice the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

In the descriptions, common or related elements and elements that are substantially the same are denoted with the same signs, and the descriptions thereof may be reduced or omitted. In the drawings, some of the same signs may be omitted for the same or substantially the same elements for case of illustration. In the drawings, the dimensions and dimensional ratios of each unit do not necessarily match the actual dimensions and dimensional ratios in the embodiments.

FIG. 1 is a block diagram of an example semiconductor device 100 according to an embodiment of the disclosure. The semiconductor device 100 may be a semiconductor memory device, such as a dynamic random access memory (DRAM) device. In some embodiments of the disclosure, the semiconductor device 100 may be included in a semiconductor memory device. The DRAM device may include an interface die and a plurality of core dies which are stacked on the interface die. In the example diagram of FIG. 1, certain components are shown located on an interface (IF) die 130, while other components are shown as part of each of core dies 140. For the sake of clarity, only a single core die 140 and its components are shown; however, there may be multiple core dies (e.g., 2, 4, 6, 8, 16, or more) each with similar components to each other. The example semiconductor device 100 of FIG. 1 shows a particular arrangement of components between the IF die 130 and the core die 140; however, other arrangements may be used in other embodiments. For example, a refresh control circuit 116 may be on the IF die 130 in some embodiments. For the sake of illustration, the core die 140 is drawn as a rectangular box which is smaller than the IF 130; however, the core die 140 and IF die 130 may have any size relationship to each other. For example, the core die 140 and IF die 130 may be approximately the same size.

The semiconductor device 100 includes a memory array 118 on each of the core dies 140. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. Selection of the word line WL is performed by a row decoder 108 and selection of the bit lines BL is performed by a column decoder 110, each of which may also be located on each of the core dies 140. In the embodiment of FIG. 1, the row decoder 108 includes a respective row decoder for each memory bank and the column decoder 110 includes a respective column decoder for each memory bank. The bit lines BL are coupled to a respective sense amplifier (SAMP) of the memory array 118. Read data from the bit line BL is amplified by the sense amplifier SAMP, and transferred to read/write amplifiers (RWAMPs) 120 over complementary local data lines (LIOT/B), transfer gate (TG), and complementary main data lines (MIOT/B) which are coupled to RWAMP 120. Conversely, write data outputted from RWAMP 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals located on the IF die 130 that include command and address (CA) terminals coupled to a command and address bus to receive commands and addresses and a chip select (CS) signal, clock terminals to receive clocks CK and /CK, data terminals DQ to provide data, and power supply terminals to receive power supply potentials VDD, VSS, and VDDQ.

The clock terminals on the IF die 130 are supplied with external clocks CK and /CK that are provided to an input circuit 112. The external clocks CK and /CK may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal clocks LCLK are provided to an input and output (IO) circuit 122 to time operation of circuits included in the IO circuit 122, for example, to data receivers to time the receipt of write data.

The internal clocks LCLK may include a read clock (RCLK) which is used to control the timing of read operations, and a write clock (WCLK) which is used to control the timing of write operations. The internal clocks may be passed to the IO circuit 122. In some instances, the internal clocks may also be passed to internal components, such as RWAMP 120, of the core die 140.

The CA terminals of the IF die 130 may be supplied with memory addresses. The memory addresses supplied to the CA terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The CA terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to the command decoder 106 via the command/address input circuit 102 of the IF die 130. The command decoder 106 includes circuits to decode the internal command signals to generate various internal signals and commands for performing operations. For example, the command decoder 106 may provide a row command signal to select a word line and a column command signal to select a bit line.

The semiconductor device 100 may receive an access command which is a read command. When a read command is received, and a bank address, a row address and a column address are timely supplied with an activate command and the read command, read data is read from memory cells in the memory array 118 corresponding to the row address and column address. The read command is received by the command decoder 106, which provides internal commands so that the read data from the memory cells in the memory array 118 is provided to RWAMP 120. The read data is output to outside the semiconductor device 100 from the data terminals DQ via the IO circuit 122.

The semiconductor device 100 may receive an access command which is a write command. When the write command is received, and a bank address, a row address and a column address are timely supplied with an activate command and the write command, write data is supplied through the DQ terminals to RWAMP 120. The write data supplied to the data terminals DQ is written to the memory cells in the memory array 118 corresponding to the row address and column address. The write command is received by the command decoder 106, which provides internal commands so that the write data is received by data receivers in the IO circuit 122. Write clocks may also be provided to the external clock terminals for timing the receipt of the write data by the data receivers of the IO circuit 122. The write data is supplied via the IO circuit 122 to RWAMP 120.

The semiconductor device 100 may also receive commands causing it to carry out one or more refresh operations as part of a self-refresh mode. In some embodiments, the self-refresh mode command may be externally issued to the semiconductor device 100. In some embodiments, the self-refresh mode command may be periodically generated by a component of the device. In some embodiments, when an external signal indicates a self-refresh entry command, the refresh signal AREF may also be activated.

The power supply terminals of the IF die 130 are supplied with power supply potentials VDD and VSS. The power supply potentials VDD and VSS are supplied to an internal voltage generator circuit 124. The internal voltage generator circuit 124 generates various internal potentials such as VPP, VOD, VARY, VPERI, and the like based on the power supply potentials VDD and VSS.

The power supply terminals of the IF die 130 are also supplied with power supply potential VDDQ. The power supply potential VDDQ is supplied to the IO circuit 122. The power supply potential VDDQ may be the same potentials as the power supply potential VDD in one embodiment of the disclosure. The power supply potential VDDQ may be different potentials from the power supply potential VDD in another embodiment of the disclosure. The power supply potential VDDQ are used for the IO circuit 122 so that power supply noise generated by the IO circuit 122 does not propagate to the other circuit blocks.

In some embodiments of the disclosure, the plurality of memory cells MC form a memory cell array in each memory bank of the memory array 118. The memory cell array may include a plurality of memory mats MAT (not separately depicted in the drawing of FIG. 1). The memory cell array may be divided into a plurality of memory mats MAT. Each memory mat MAT has a group of word lines and bit lines assigned thereto. In the assigned group, an array of the word lines extends in a first horizontal direction, and an array of the bit lines extends in a second horizontal direction perpendicular (or substantially perpendicular within reasonable tolerances of fabrication, measurement, etc.) to the first horizontal direction. Each line extends through the memory mat MAT to an outside area of the memory mat MAT. In the outside area of the memory mat MAT, word line drivers may be coupled to the word lines and sense amplifiers may be coupled to the bit lines. The memory mat may also be referred to as a memory array mat.

Figure 2:
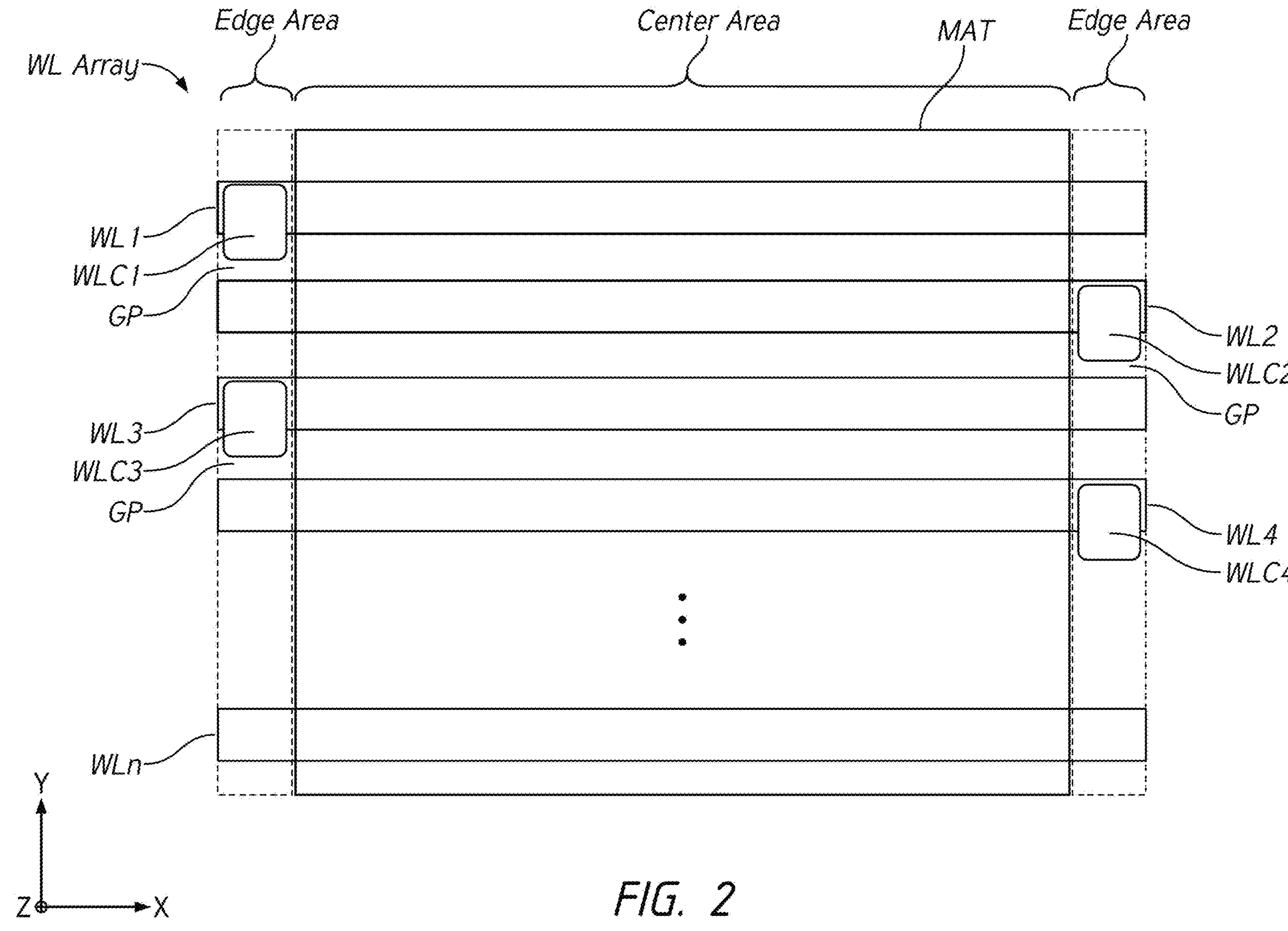
FIG. 2 depicts a schematic configuration of an example word line array in a plan view according to an embodiment of the disclosure.

FIG. 2 depicts a schematic configuration of an example word line array in a plan view according to an embodiment of the disclosure. The word line array includes a plurality of word lines WL1-WLn (which may also be collectively referred to as WL) extending in one horizontal direction (e.g., a first horizontal direction along X-axis in the drawing) and arranged in parallel with each other in another horizontal direction (e.g., a second horizontal direction along Y-axis in the drawing). Each word line WL extends through and to the outside of a memory mat (or a memory array mat) MAT in the first horizontal direction.

An area of the word line array inside the memory mat MAT in the plan view may be referred to as a center area. An area of the word line array outside the memory mat MAT may be referred to as an edge area. The center area and the edge area may include a center portion and an edge portion of each word line WL, respectively. The edge area includes at least two edge areas on one side and another side of the outside of the memory mat MAT in the first horizontal direction. The center area may be a middle area between the two edge areas.

At the edge area outside the memory mat MAT, a word line contact WLC is provided to each word line WL. The word line contact WLC may be at least in electrical contact with the word line WL. In the illustrated example, there are word line contacts WLC provided to every two word lines (e.g., every odd word lines) WL on one side of the memory mat MAT and different every two word lines (e.g., every even word lines) WL on another side of the memory mat MAT. For example, on the left side of the memory mat MAT in the drawing of FIG. 2, the word line contacts WLC1 and WLC3 are provided to the first and third word lines WL1 and WL3 of the first and third rows of the array, respectively, and on the right side of the memory mat MAT, the word line contacts WLC2 and WLC4 are provided to the second and fourth word lines WL2 and WL3 of the second and fourth rows of the array, respectively.

Furthermore, there is a gap GP between one word line contact WLC of the word line WL (e.g., the first word line WL1) in one row and another word line WL (e.g., the second word line WL2) arranged adjacent to the first word line WL1 in another row. This way, the word line contact WLC1 of the first word line WL1 is separated by the gap GP from the second word line WL2 to prevent a short circuit therebetween. The gap GP electrically isolates the word line contact WLC1 from the second word line WL2. The gap GP has therefore a short-circuit margin between the neighboring word line contact and word line, such as WLC1 in the first row and WL2 in the second row or WLC2 in the second row and WL3 in the third row in the illustrated configuration.

Figure 3:
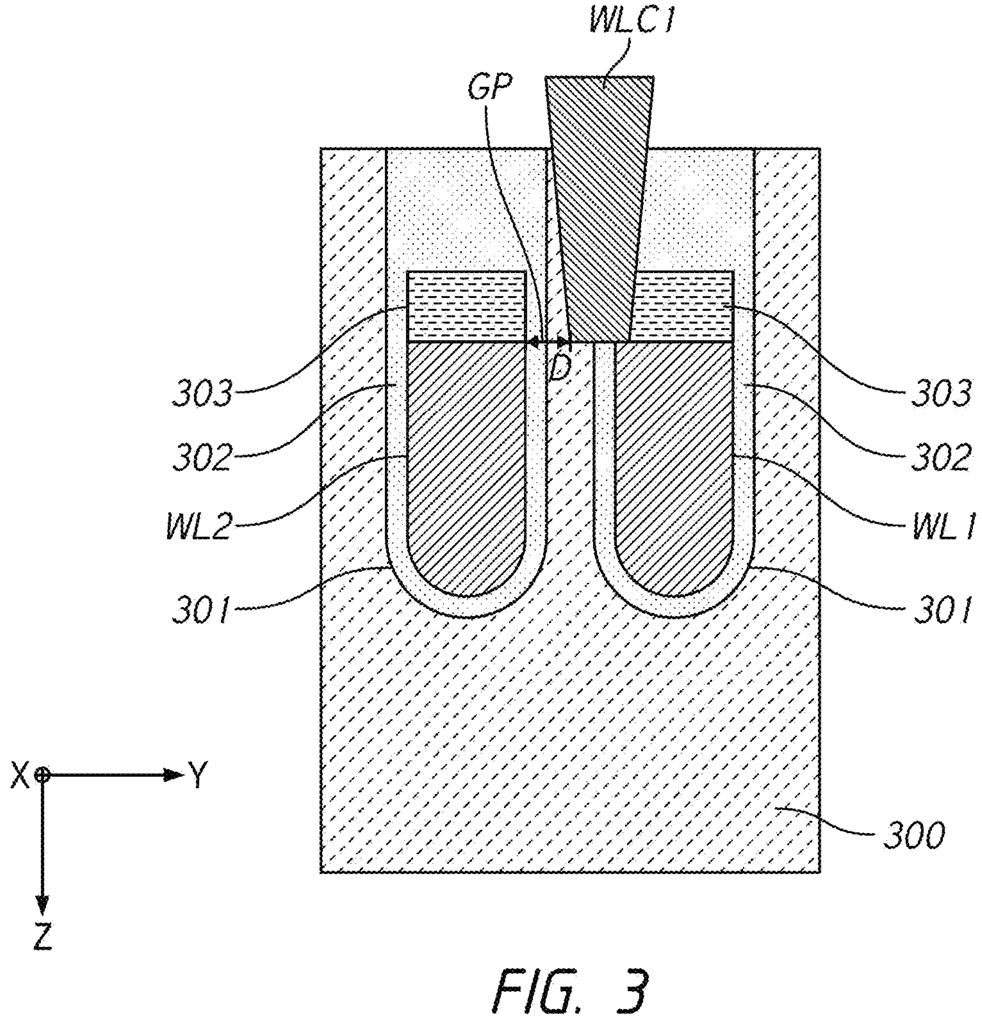
FIG. 3 depicts a schematic configuration of an example word line structure in a cross-sectional view according to an embodiment of the disclosure.

FIG. 3 depicts a schematic configuration of an example word line structure in a cross-sectional view according to an embodiment of the disclosure. In the illustrated configuration, the word lines WL1 and WL2 are buried in respective trenches 301 formed in a semiconductor substrate 300 with an oxide film 302 therebetween. The word line contact WLC1 is provided to the first word line WL1. There is also a poly silicon layer 303 formed on each of the word lines WL1 and WL2. The poly silicon layer 303 may increase device refresh characteristics. The word line contact WLC1 goes through the poly silicon layer 303 of the first word line WL1, and at least a portion (e.g., a bottom portion) thereof lands on or touches at least a portion (e.g., a top portion) of the first word line WL1. While at least the portion of the word line contact WLC1 is in electrical contact with the first word line WL1, the word line contact WLC1 is electrically isolated from the second word line WL2 by the gap GP therebetween. The gap GP may have a dimension D for preventing a short circuit between the word line contact WLC1 of the first word line WL1 and the neighboring second word line WL2. As design rules require a memory device to shrink further, the gap GP may become smaller.

Figures 4A, 4B:
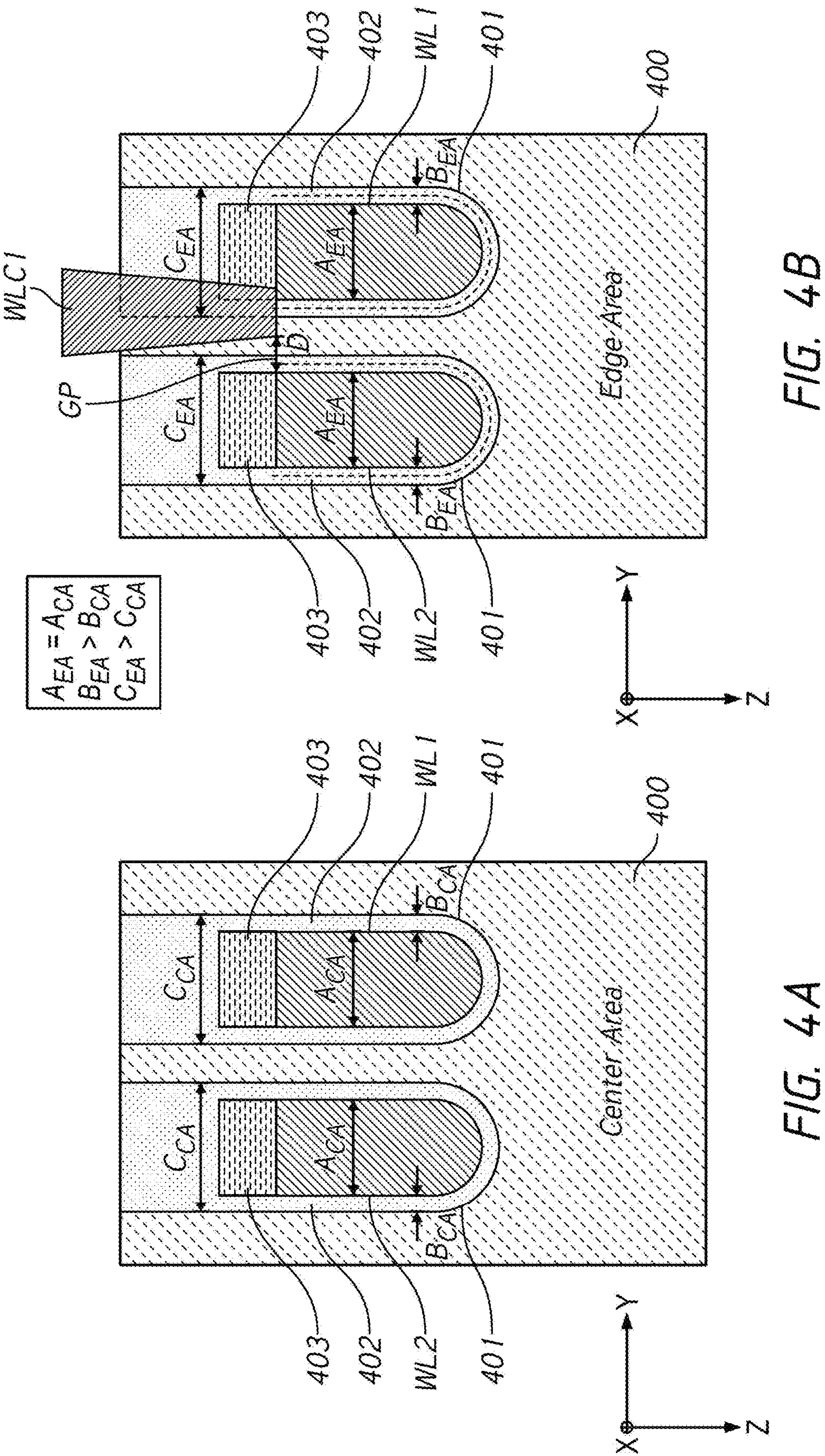
FIG. 4A depicts a schematic configuration of an example center area word line structure in a cross-sectional view according to an embodiment of the disclosure.
FIG. 4B depicts a schematic configuration of an example edge area word line structure in a cross-sectional view according to an embodiment of the disclosure.

FIG. 4A depicts a schematic configuration of an example center area word line structure in a cross-sectional view according to an embodiment of the disclosure. FIG. 4B depicts a schematic configuration of an example edge area word line structure in a cross-sectional view according to an embodiment of the disclosure. The word line structures of FIG. 4A and FIG. 4B each have the same elements as those of the word line structure of FIG. 3, including a trench 401, an oxide film 402, and a poly silicon layer 403 which correspond to the trench 301, the oxide film 302, and the poly silicon layer 303, respectively. In the present embodiment, in order to provide the gap GP sufficiently large to prevent a short circuit between the word line contact WLC1 of the first word line WL1 and the second word line WL2, the edge area of each of the word lines WL1 and WL2 has a cross-sectional width (or a critical dimension CD in the Y-axis direction in the drawing) $A_{EA}$ equivalent to a cross-sectional width $A_{CA}$ of the center area of each of the word lines WL1 and WL2. $A_{EA}$ may be the same or substantially the same within reasonable tolerances of fabrication, measurement, etc. as $A_{CA}$. Herein, WL1 and WL2 may be collectively referred to as WL.

In the present embodiment, a cross-sectional width $C_{EA}$ of the trench 401 formed in a semiconductor substrate 400 at the edge area is set to be greater than a cross-sectional width $C_{CA}$ of the trench 401 at the center area based on memory device specifications, design rules, or the like. With the trench dimension relation $C_{EA}>C_{CA}$, a cross-sectional width or a thickness $B_{EA}$ of the oxide film 402 deposited on a surface of the trench 401 at the edge area is made greater than a cross-sectional width or a thickness $B_{CA}$ of the oxide film 402 at the center area ($B_{EA}>B_{CA}$), whereas the $A_{EA}$ of the edge area of the word line WL is made equivalent to $A_{CA}$ of the center area of the word line WL ($A_{EA}=A_{CA}$) as illustrated in the drawing. As one example, the oxide film 402 at the edge area may include a stacked oxide film including multiple oxide films stacked on each other, which increases the total thickness of the oxide film 402 so that it is thicker than the oxide film 402 at the center area. The dotted line in the oxide film 402 in the drawing of FIG. 4B indicates that there are multiple oxide films stacked or layered on one another. The stacked oxide film (such as oxide films 502 and 504) is further described below. The oxide film 402 at the center area may include a single oxide film. With the above configuration having $A_{EA}=A_{CA}$ and $B_{EA}>B_{CA}$ in the trench of $C_{EA}>C_{CA}$, the gap GP with the sufficient dimension D can be obtained to prevent a short circuit between the word line contact WLC1 of the first word line WL1 and the neighboring second word line WL2.

FIGS. 5A-5G depict example processes for forming a word line structure in a semiconductor substrate in a plan view according to an embodiment of the disclosure. The word line may be the word lines WL in FIG. 1. The word line may be the word lines WL1, WL2, . . . . WLn in FIGS. 2-4B.

Figure 5A:
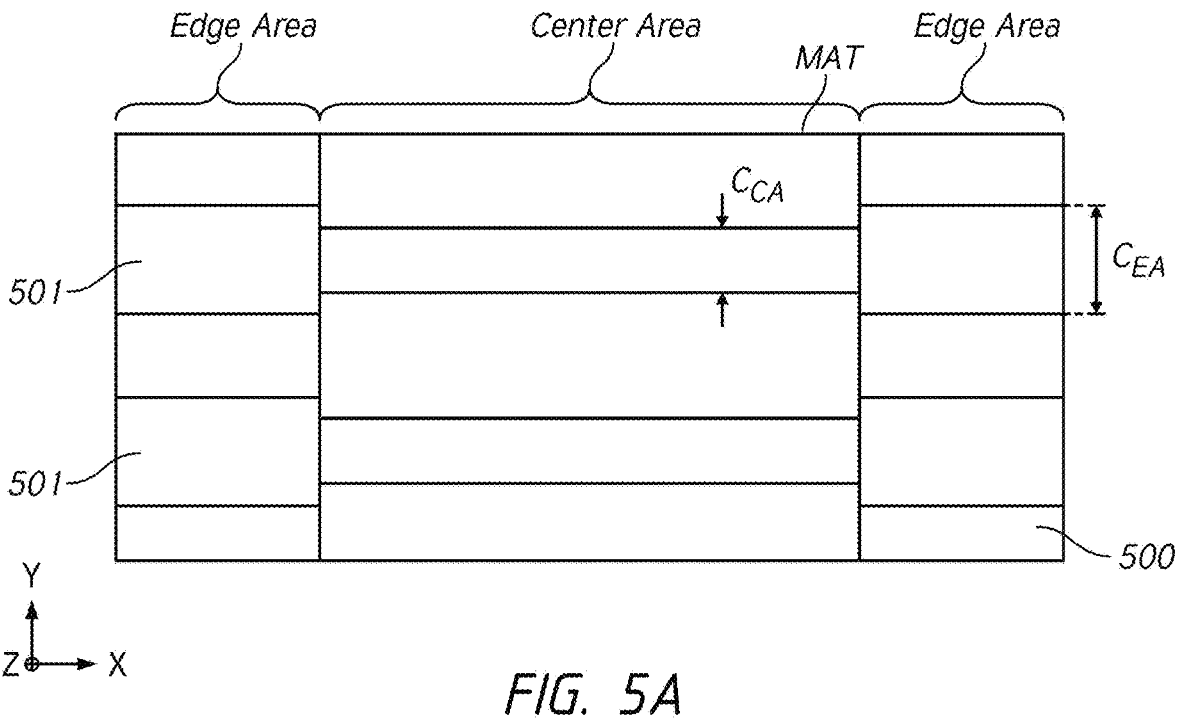
FIGS. 5A-5G depict example processes for forming a word line structure in a semiconductor substrate in a plan view according to an embodiment of the disclosure.

As shown in FIG. 5A, trenches 501 are formed in a semiconductor substrate 500 by, for example, etching. The trenches 501 extend in the first horizontal direction (e.g., the X-axis direction in the drawing) and are arranged in parallel with each other in the second horizontal direction (e.g., the Y-axis direction in the drawing). Each trench 501 extends through and to the outside of the memory mat MAT in the first horizontal direction. The trench 501 in the center area within the memory mat MAT and the trench 501 in the edge area outside the memory mat MAT have the width dimension relation $C_{EA}>C_{CA}$ based on memory device specifications, design rules, or the like.

Figure 5B:
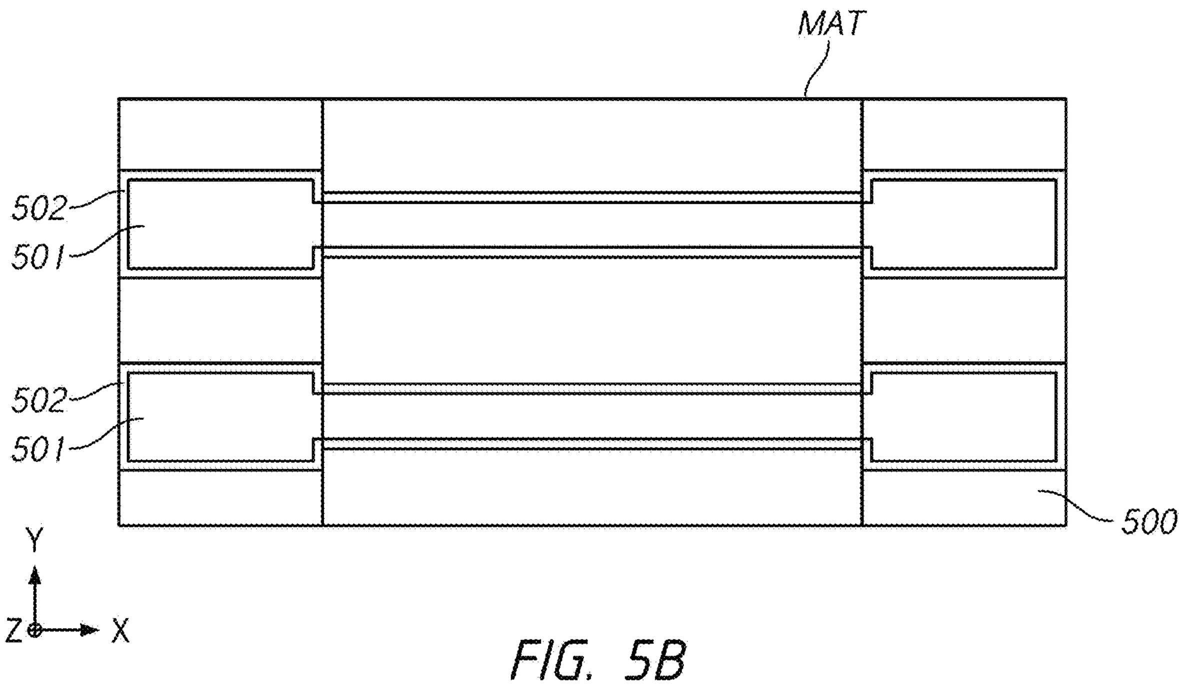

As shown in FIG. 5B, oxide films 502 are provided to surfaces of the trenches 501 by, for example, oxide deposition. The oxide films 502 may be oxide layers. A thickness of the oxide film 502 at the center area and that at the edge area may be the same (or substantially the same within reasonable tolerances of fabrication, measurement, etc.) with each other.

Figure 5C:
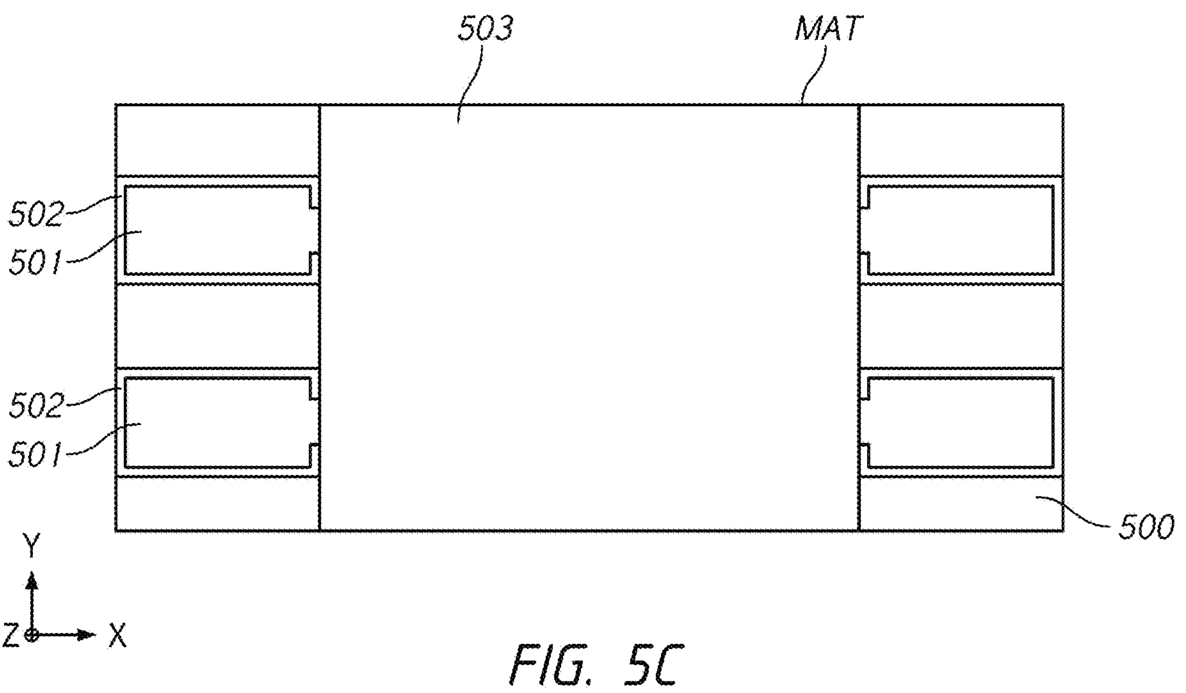

As shown in FIG. 5C, a photo resist film 503 is provided to the area of the memory mat MAT as a hard mask to cover the memory mat area in the top view. Any conventional techniques to provide a hard mask of a photo resist material may be used as appropriate.

Figure 5D:
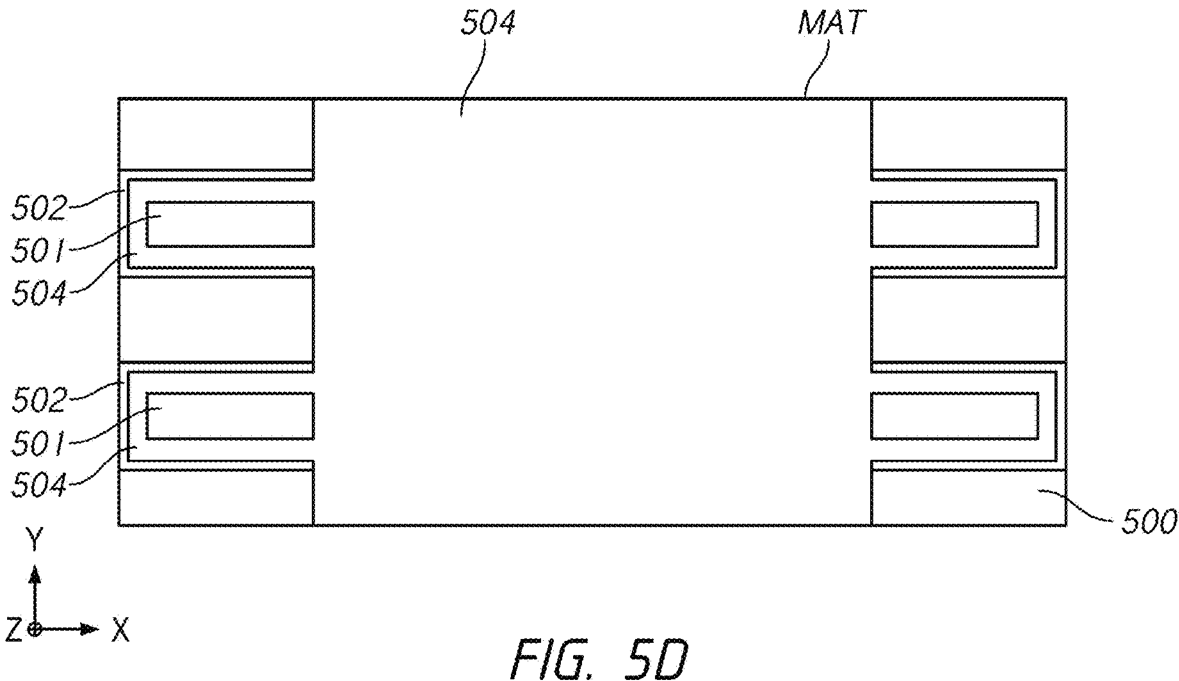

As shown in FIG. 5D, additional oxide films 504 are provided onto the oxide films 502 in the trenches 501 by, for example, another oxide deposition. This provides a stack of the first oxide film 502 and the second oxide film 504 and increases the total oxide film thickness in each trench 501. The additional oxide deposition may include, for example, radical deposition of oxygen radicals. An example condition of the additional oxide deposition includes, but is not limited to, a temperature range of 60-100° C. and a pressure range of 300-500 Pa. Process conditions may be used and adjusted as appropriate to achieve the desired dimension of the oxide film 504. The total oxide film thickness that is the thickness of the stacked oxide films 502 and 504 in the trench 501 can be selectively controlled. The materials for the oxide films 502 and 504 may be the same or may be different. The oxide films 502 and 504 may also be referred to as a first sub-oxide film 502 and a second sub-oxide film 504, respectively. The two sub-oxide films 502 and 504 together may form a stacked oxide film on the surface of the trench 501, which is thicker than just the oxide film 502.

Figure 5E:
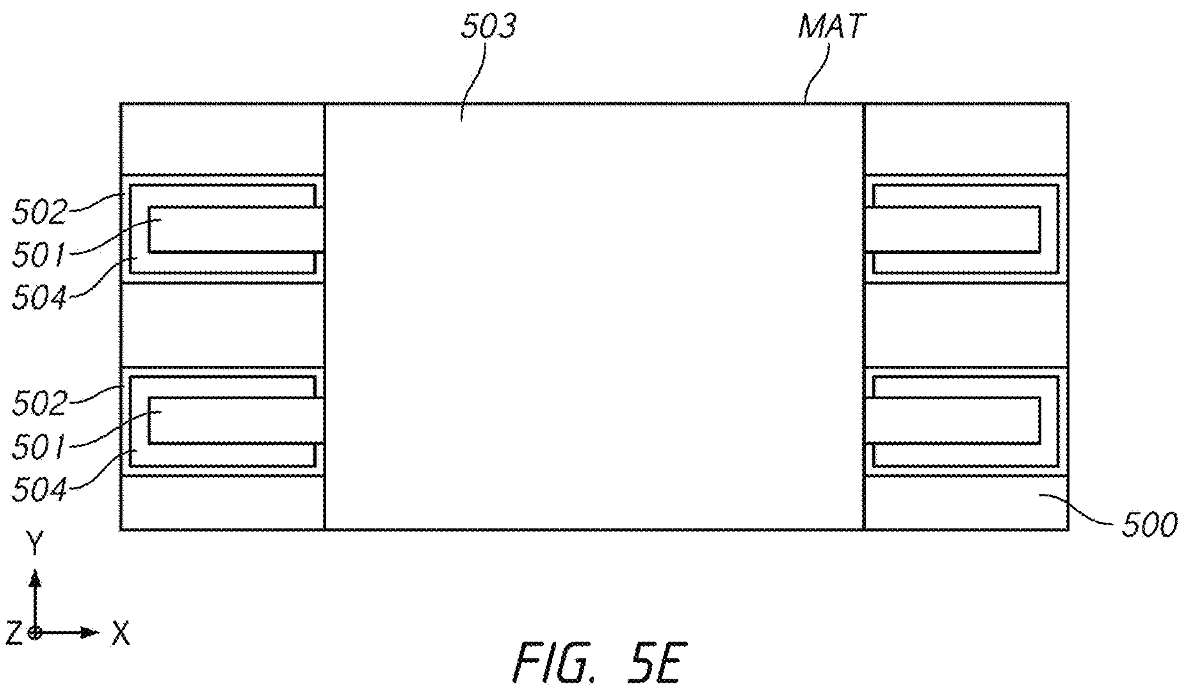
Figure 5F:
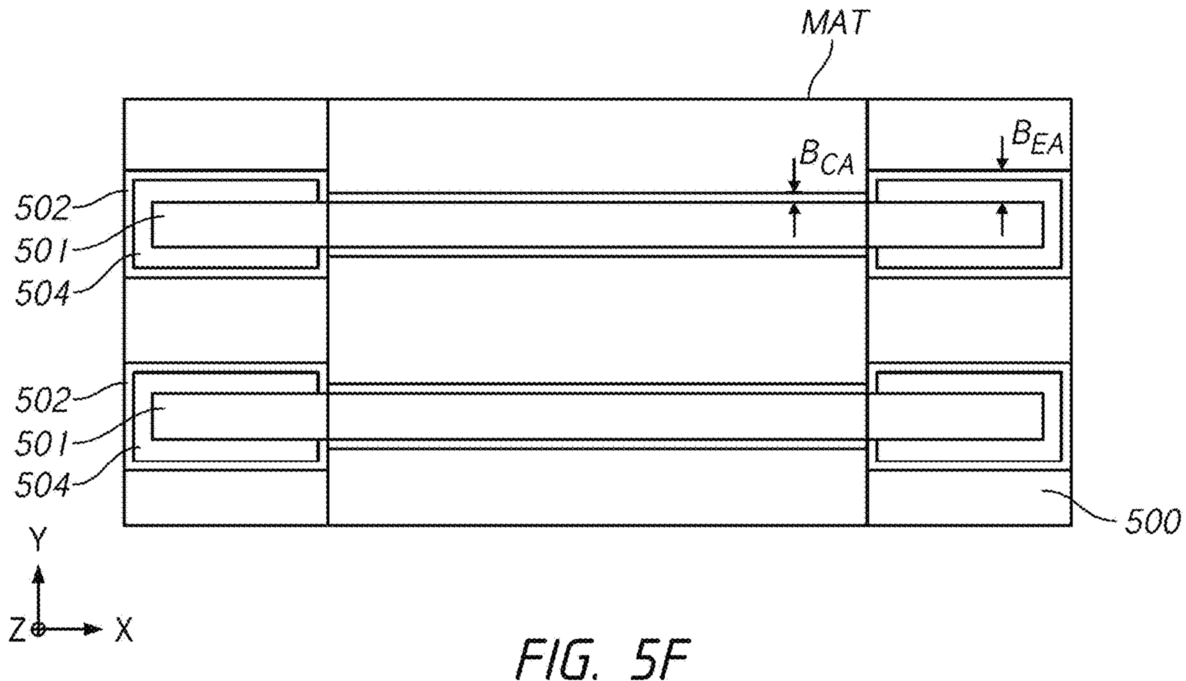

Subsequently, as shown in FIG. 5E, the oxide film 504 in the area of the memory mat MAT is removed by, for example, etch back to reveal the underlining photo resist film 503, and as shown in FIG. 5F, the photo resist film 503 is removed by, for example, wet strip. Any conventional etch back techniques and strip techniques may be used as appropriate. As illustrated, while the trench 501 at the center area in the memory mat MAT has the single oxide film by the oxide film 502, the trench 501 at the edge area outside the memory mat MAT has the staked oxide film by the oxide films 502 and 504. Furthermore, the stacked oxide film is thicker than the single oxide film $B_{EA}>B_{CA}$ such that the remaining space of the trench 501 has the uniform cross-sectional width (in the Y-axis direction in the drawing) in the edge area and the center area.

Figure 5G:
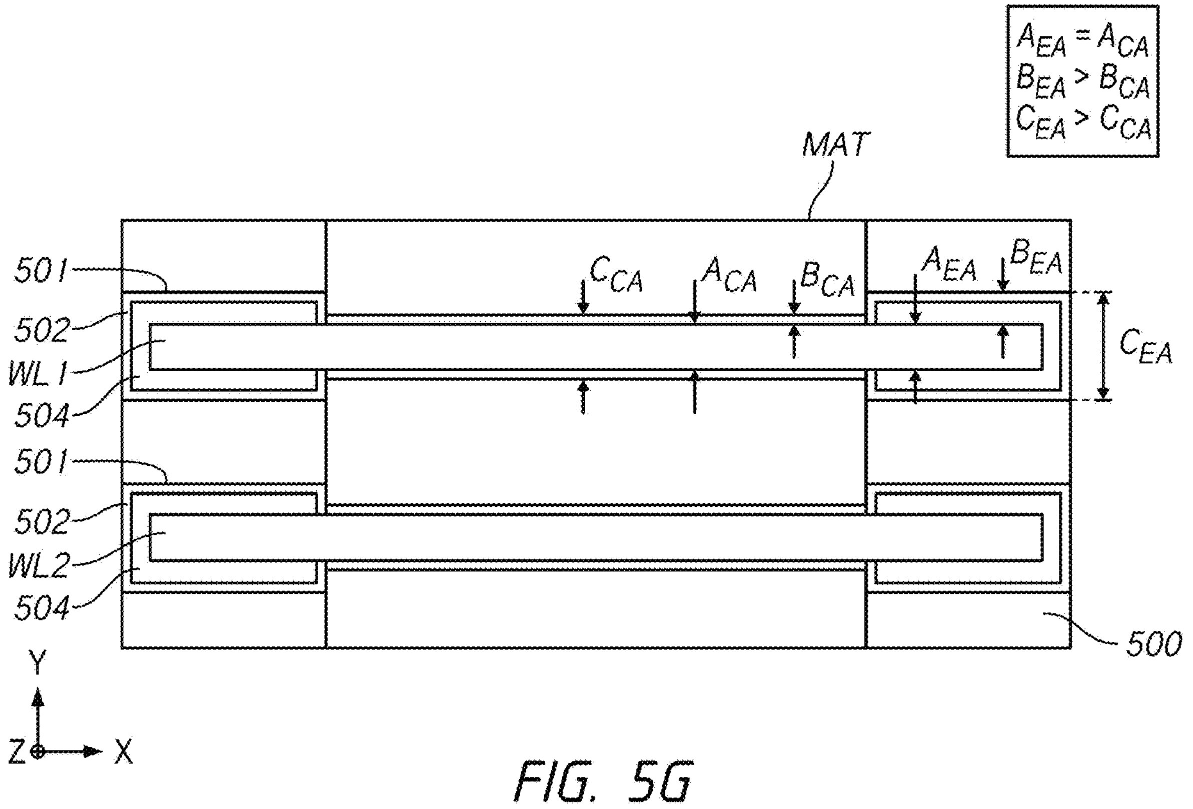

Then, as shown in FIG. 5G, the word lines WL (e.g., WL1 and WL2) are provided to fill the remaining space of the trenches 501 by, for example, deposition and etch back of a conductive material. The conductive material may be a metal material. Any conventional deposition and etch back techniques may be used as appropriate. Furthermore, although not separately depicted, a poly silicon layer, such as the poly silicon layer 303/403, is formed on the top portion of each of the word lines WL by, for example, deposition and etch back of a poly silicon material.

With the above processes according to the present embodiment, the word line configuration having specific relationships between the center area and the edge area with respect to the memory mat MAT, for example, the word line width $A_{EA}=A_{CA}$, the oxide film width $B_{EA}>B_{CA}$ (the stacked sub-oxide films 502 and 504 at the edge area being thicker than the single oxide film 502 at the center area), and the trench width $C_{EA}>C_{CA}$, provide a configuration with higher flexibility. And, with the above configuration, referring back to FIG. 4B, when the word line contact WLC1 made of a conductive material is formed by subsequent processes to be in electrical contact with the first word line WL1 while electrically isolated from the neighboring second word line WL2 by the gap GP, the gap GP may have a short-circuit margin with sufficient dimension D between the word line contact WLC1 of the first word line WL1 and the neighboring second word line WL2 to prevent a short circuit therebetween. Accordingly, it is possible to further flexibly and reliably adjust the dimension D of the gap or the short-circuit margin.

Figure 6:
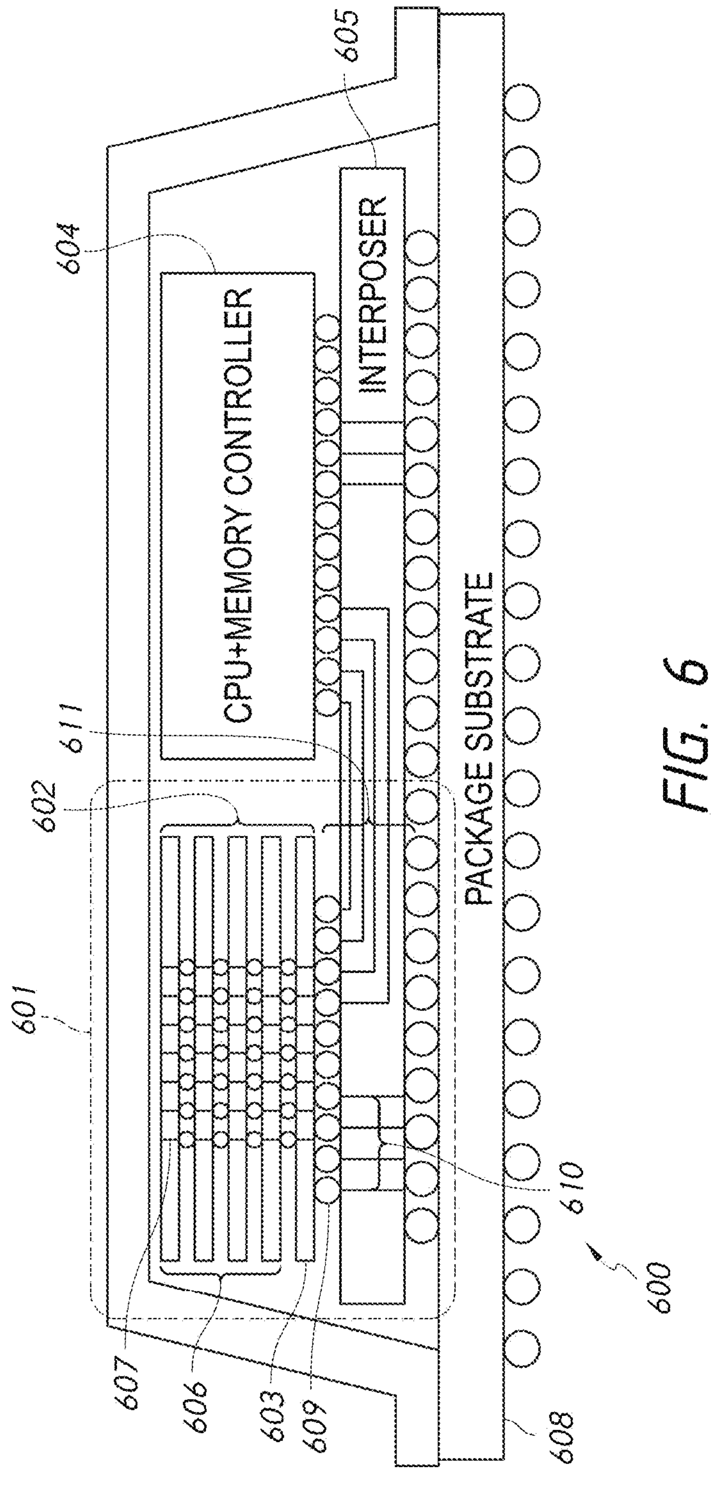
FIG. 6 depicts a schematic configuration of an example semiconductor system according to an embodiment of the disclosure.

FIG. 6 depicts a schematic configuration of an example semiconductor system 600 according to an embodiment of the disclosure. The semiconductor system 600 includes a semiconductor memory device 601 in an embodiment of the disclosure. In some embodiments of the disclosure, the semiconductor memory device 601 may include the semiconductor device 100 of FIG. 1. The semiconductor system 600 may also include a central processing unit (CPU) and memory controller 604, which may be a controller chip, on an interposer 605 on a package substrate 608. The interposer 605 may include one or more power lines 610 which may supply power supply voltage from the package substrate 608. The interposer 605 may include a plurality of channels 611 that may interconnect the CPU and memory controller 604 and the semiconductor memory device 601. The semiconductor memory device 601 may be a DRAM. The memory controller 604 may provide a clock signal, a command signal, and may further transmit and receive data signals. The plurality of channels 611 may transmit the data signals between the memory controller and the memory device 601.

The semiconductor memory device 601 may include a plurality of dies (or chips) 602 including at least one interface (IF) die (or chip) 603 and a plurality of memory core dies (or chips) 606 stacked with each other. In some embodiments, each of the plurality of memory core dies 606 may include the core die 140 and the IF die 603 may include the IF die 130 of the semiconductor device 100.

A number of the memory core dies 606 may not be limited to four as in the illustrated example, and may be more or fewer as appropriate. Each of the memory core dies 606 may include a plurality of memory cells and circuitries accessing the memory cells. For example, the memory cells may be DRAM cells. The memory cells may be arranged in array. The semiconductor memory device 601 may include conductive vias 607 which couple the IF die 603 and the memory core dies 606 by penetrating the IF die 603 and the memory core dies 606. The IF die 603 may be coupled to the interposer 605 via interconnects 609. For example, the interconnects 609 may be microbumps having bump pitches of less than about or less than one hundred micrometers and exposed on an outside of the IF die 603. A portion of each of the interconnects 609 may be coupled to the one or more power lines 610. Another portion of each of the interconnects 609 may be coupled to one or more of the channels 611.

DRAM is merely one example, and the embodiments and the descriptions herein are not intended to be limited to DRAM. Memory devices other than DRAM, such as a static random-access memory (SRAM), a flash memory, an erasable programmable read-only memory (EPROM), a magnetoresistive random-access memory (MRAM), and a phase-change memory, can also be applied as the semiconductor memory device 901. Furthermore, devices other than memory, including logic ICs, such as a microprocessor and an application-specific integrated circuit (ASIC), are also applicable as the semiconductor device according to the present embodiments.

Although various embodiments of the disclosure have been described in detail, it will be understood by those skilled in the art that embodiments of the disclosure may extend beyond the specifically described embodiments to other alternative embodiments and/or uses and modifications and equivalents thereof. In addition, other modifications which are within the scope of the disclosure will be readily apparent to those of skill in the art based on the described embodiments. It is also contemplated that various combination or sub-combination of the specific features and aspects of the embodiments may be made and still fall within the scope of the disclosure. It should be understood that various features and aspects of the embodiments can be combined with or substituted for one another in order to form varying mode of the embodiments. Thus, it is intended that the scope of the disclosure should not be limited by the particular embodiments described above.

What is claimed is:

1. An apparatus, comprising:

a word line array including a plurality of word lines each extending through a memory mat in a first horizontal direction, the plurality of word lines including a first word line and a second word line arranged adjacent to each other in a second horizontal direction, the second horizontal direction perpendicular to the first horizontal direction; and a word line contact of the first word line, the word line contact separated from the second word line by a gap, wherein the first and second word lines each have a first oxide film at a center area of the word line array in the memory mat, and the first and second word lines each have a second oxide film at an edge area of the word line array outside the memory mat, the second oxide film having a thickness greater than a thickness of the first oxide film.

2. The apparatus according to claim 1, wherein the gap has a dimension to prevent a short circuit between the word line contact of the first word line and the second word line.

3. The apparatus according to claim 2, wherein the gap has a short-circuit margin.

4. The apparatus according to claim 1, wherein the word line contact is in contact with the first word line in the edge area of the word line array.

5. The apparatus according to claim 1, wherein the first and second word lines each are in respective trenches in a semiconductor substrate, and the second oxide film includes a first sub-oxide film on a surface of the respective trenches and a second sub-oxide film on a surface of the first sub-oxide film.

6. The apparatus according to claim 1, wherein the first and second word lines each have a first cross-sectional width at the edge area of the word line array equivalent to a second cross-sectional width at the center area of the word line array.

7. The apparatus according to claim 6, wherein the first and second word lines each are in respective trenches in a semiconductor substrate, and each of the respective trenches has a third cross-sectional width at the edge area of the word line array greater than a fourth cross-sectional width at the center area of the word line array.

8. The apparatus according to claim 1, wherein the first and second word lines each have a first cross-sectional width at the edge area of the word line array equivalent to a second cross-sectional width at the center area of the word line array, the first and second word lines each are in respective trenches in a semiconductor substrate, and each of the respective trenches has a third cross-sectional width at the edge area of the word line array greater than a fourth cross-sectional width at the center area of the word line array, and the gap has a dimension to prevent a short circuit between the word line contact of the first word line and the second word line.

9. The apparatus according to claim 1, wherein the first oxide film is a single oxide film, and the second oxide film is a stacked oxide film including multiple oxide films stacked on one another.

10. An apparatus, comprising:

a word line array including a plurality of word lines extending in a first horizontal direction, the plurality of word lines including a first word line and a second word line arranged adjacent to each other in a second horizontal direction, the second horizontal direction perpendicular to the first horizontal direction; and a word line contact of the first word line, the word line contact separated from the second word line by a gap, wherein the first and second word lines each have a first oxide film at a center area of the word line array and a second oxide film at an edge area of the word line array, the second oxide film having a thickness greater than a thickness of the first oxide film, the first and second word lines each have a first cross-sectional width at the edge area of the word line array equivalent to a second cross-sectional width at the center area of the word line array, and the first and second word lines each are in respective trenches in a semiconductor substrate, and each of the respective trenches has a third cross-sectional width at the edge area of the word line array greater than a fourth cross-sectional width at the center area of the word line array.

11. The apparatus according to claim 10, wherein the plurality of word lines each extend through a memory mat in the first horizontal direction, the center area of the word line array is in the memory mat, and the edge area of the word line array is outside the memory mat.

12. The apparatus according to claim 10, wherein the gap has a short-circuit margin having a dimension to prevent a short circuit between the word line contact of the first word line and the second word line.

13. The apparatus according to claim 10, wherein the word line contact is in contact with the first word line in the edge area of the word line array outside a memory mat.

14. The apparatus according to claim 10, wherein the second oxide film includes a first sub-oxide film on a surface of the trench and a second sub-oxide film on a surface of the first sub-oxide film.

15. An apparatus, comprising:

a first word line in a first trench in a semiconductor substrate;

a first oxide film between the first word line and the first trench;

a first word line contact of the first word line;

a second word line in a second trench in the semiconductor substrate, the second word line and the second trench arranged adjacent to the first word line and the first trench, respectively; and a second oxide film between the second word line and the second trench, wherein the first word line contact of the first word line is separated from the second word line by a gap, the first word line has a center portion in a memory mat and an edge portion outside the memory mat, and the first oxide film at the edge portion of the first word line includes a first sub-oxide film and a second sub-oxide film stacked on each other, and has a thickness greater than a thickness of the first oxide film at the center portion of the first word line.

16. The apparatus according to claim 15, wherein the gap has a dimension to prevent a short circuit between the first word line contact of the first word line and the second word line.

17. The apparatus according to claim 15, wherein the first oxide film at the center portion of the first word line includes a single oxide film, and a total thickness of the stacked first and second sub-oxide films is greater than a thickness of the single oxide film.

18. The apparatus according to claim 17, wherein the edge portion of the first word line has a cross-sectional width equivalent to a cross-sectional width of the center portion of the first word line.

19. The apparatus according to claim 18, wherein the first trench at the edge portion of the first word line has a cross-sectional width greater than a cross-sectional width of the first trench at the center portion of the first word line.

20. The apparatus according to claim 15, wherein the first and second word lines extend through the memory mat in a first horizontal direction and are arranged adjacent to each other in a second horizontal direction, the second horizontal direction perpendicular to the first horizontal direction.

* * * * *